(12) United States Patent
Green et al.

(10) Patent No.: US 7,317,405 B2
(45) Date of Patent: Jan. 8, 2008

(54) SOLAR-POWERED WIRELESS CROSSWALK WARNING SYSTEM

(75) Inventors: David Robin Green, Victoria (CA); Jim Ward, Saanichton (CA); Neil Wyper, Victoria (CA)

(73) Assignee: Carmanah Technologies Corporation, Victoria, British Columbia (CA)

( * ) Notice: Subject to any disclaimer, the term of this patent is extended or adjusted under 35 U.S.C. 154(b) by 390 days.

(21) Appl. No.: 10/995,264

(22) Filed: Nov. 24, 2004

(65) Prior Publication Data

US 2005/0128105 A1    Jun. 16, 2005

Related U.S. Application Data

(63) Continuation-in-part of application No. 10/475,574, filed on Aug. 9, 2005.

(51) Int. Cl.
G08G 1/095    (2006.01)

(52) U.S. Cl. ............... 340/907; 340/908; 340/925; 340/944; 116/63 R

(58) Field of Classification Search ............ 340/907, 340/908, 909, 917, 918, 925, 945, 944; 116/63 R; 362/183
See application file for complete search history.

(56) References Cited

U.S. PATENT DOCUMENTS

| | | | |
|---|---|---|---|
| 3,968,584 A | 7/1976 | Kingston | |
| 4,009,535 A | 3/1977 | Stock | |
| 4,025,922 A * | 5/1977 | Trawick, III | 342/24 |
| 4,050,834 A | 9/1977 | Lee | |
| 4,097,308 A | 6/1978 | Klein et al. | |
| 4,200,904 A * | 4/1980 | Doan | 362/183 |
| 4,224,081 A | 9/1980 | Kawamura et al. | |
| 4,380,038 A | 4/1983 | Roudeau | |
| 4,383,129 A | 5/1983 | Gupta et al. | |
| 4,578,526 A | 3/1986 | Nakano et al. | |
| 4,625,070 A | 11/1986 | Berman et al. | |
| 4,626,852 A | 12/1986 | Dodge | |
| 4,633,032 A | 12/1986 | Oido et al. | |
| 4,636,578 A | 1/1987 | Feinberg | |
| 4,692,557 A | 9/1987 | Samuelson et al. | |
| 4,759,735 A | 7/1988 | Pagnol et al. | |
| 4,862,613 A | 9/1989 | Eyngorn | |
| 4,869,755 A | 9/1989 | Huschka et al. | |
| 4,903,172 A | 2/1990 | Schoniger et al. | |
| 4,999,060 A | 3/1991 | Szekely et al. | |
| 5,001,475 A * | 3/1991 | Scovin | 340/908 |
| 5,007,190 A | 4/1991 | Shyu | |

(Continued)

FOREIGN PATENT DOCUMENTS

WO    WO 96 02947    2/1996

(Continued)

*Primary Examiner*—Davetta W. Goins
(74) *Attorney, Agent, or Firm*—Paul Smith; Paul Smith Intellectual Property Law

(57) ABSTRACT

A solar-powered crosswalk warning system is disclosed. The crosswalk warning system comprises two or more crosswalk warning beacons, located on opposite sides of the road. Each beacon comprises a solar panel to recharge a battery, a battery back, a control unit to charge the battery pack during daylight hours, a communication unit to communicate to the second crosswalk beacon, a traffic signal lamp ton warn oncoming traffic, and a triggering means by which the pedestrian can activate the beacons.

20 Claims, 5 Drawing Sheets

U.S. PATENT DOCUMENTS

| | | | |
|---|---|---|---|
| 5,008,062 A | 4/1991 | Anderson et al. | |
| 5,124,890 A | 6/1992 | Choi et al. | |
| 5,252,139 A | 10/1993 | Schmitt et al. | |
| 5,252,141 A | 10/1993 | Inoue et al. | |
| 5,252,969 A * | 10/1993 | Kishi | 340/908 |
| 5,460,325 A | 10/1995 | Surman | |
| 5,522,540 A | 6/1996 | Surman | |
| 5,570,000 A | 10/1996 | Kowalski | |
| 5,573,328 A | 11/1996 | Hwang | |
| 5,610,599 A * | 3/1997 | Nomura et al. | 340/931 |
| 5,678,334 A | 10/1997 | Schoniger | |
| 5,680,033 A | 10/1997 | Cha | |
| 5,697,175 A | 12/1997 | Schwartz | |
| 5,729,924 A | 3/1998 | Reading | |
| 5,734,339 A | 3/1998 | Ogle | |
| 5,743,970 A | 4/1998 | Czubatjy et al. | |
| 5,782,552 A | 7/1998 | Green et al. | |
| 5,829,177 A | 11/1998 | Hjaltason | |
| 5,954,423 A | 9/1999 | Logan et al. | |
| 5,959,554 A * | 9/1999 | Armstrong et al. | 340/908 |
| 6,013,985 A | 1/2000 | Green et al. | |
| 6,046,401 A | 4/2000 | McCabe | |
| 6,076,294 A | 6/2000 | Durbin | |
| 6,094,849 A | 8/2000 | Phillips et al. | |
| 6,107,941 A * | 8/2000 | Jones | 340/944 |
| 6,114,046 A | 9/2000 | Hanoka | |
| 6,124,807 A * | 9/2000 | Heckeroth et al. | 340/908 |
| 6,127,943 A * | 10/2000 | Tauchi et al. | 340/944 |
| 6,135,620 A | 10/2000 | Marsh | |
| 6,204,443 B1 | 3/2001 | Kiso et al. | |
| 6,268,805 B1 | 7/2001 | Simon | |
| 6,384,742 B1 | 5/2002 | Harrison | |

FOREIGN PATENT DOCUMENTS

| | | |
|---|---|---|
| WO | WO 01 13038 | 2/2001 |

* cited by examiner

SOLAR-POWERED WIRELESS CROSSWALK WARNING SYSTEM

CROSS REFERENCE TO RELATED APPLICATIONS

This application is a continuation-in-part of, and claims priority from, co-pending application Ser. No. 10/475,574 filed 22 Oct. 2003, which itself claims priority from U.S. Provisional Patent application No. 60/285,941 filed 23 Apr. 2001.

FIELD OF THE INVENTION

This invention relates to crosswalk warning systems equipped with warning lights, usually situated on each side of the road (as well as on the meridian if present) which can be activated by the pedestrian.

BACKGROUND OF THE INVENTION

Crosswalks are a means of allowing pedestrians to cross streets at designated locations with comparative safety. At street intersections, pedestrians are usually assisted in crossing the street by the traffic control signage or signal equipment, which may include "WALK", "DON'T WALK" lighted signs, or the analogous iconographic lighted signs, linked to the traffic light system.

At 'mid-block' locations remote from intersections, crosswalks are usually indicated by white lines on the pavement and signage to show the location of the crosswalk. Pedestrians wanting to cross the road must stand on the side of the road at the start of the crosswalk to indicate their intention to cross the road, and drivers are expected to notice the pedestrians, stop and allow them to cross.

In darkness, where traffic levels are higher, or on multi-lane roads this minimal kind of crosswalk is not effective because drivers may not see the pedestrians waiting at the crosswalk, or may ignore them. Furthermore, pedestrians may feel empowered to cross the street when in fact they have not been noticed by the motorists. Fatalities at crosswalks are relatively common, and have caused crosswalks to be regarded as a serious safety issue. However, the alternative to crosswalks is to have no regulation of pedestrians crossing busy streets, and this is a worse alternative.

In order to improve safety at crosswalks, a number of strategies are in use. Since the danger is most pronounced at night, crosswalks are sometimes lit with overhead lighting. This is an expensive solution due to the costs of bringing electricity to the crosswalk, installing the overhead lighting across the road, and providing maintenance and electricity to the site.

Another strategy is to install flashing yellow warning signals at crosswalks so drivers notice the crosswalk and slow down, thereby improving their chance to see pedestrians using the crosswalk. These flashing signals are cheaper and easier to install than full-fledged lighting systems, and have lower on-going costs. However, since neither of these solutions is activated by the pedestrian, drivers learn that most of the time crosswalks are not being used, and they 'tune out' the crosswalk, and do not notice if pedestrians are present.

Another type of system which improves safety in crosswalks is described in our co-pending application Ser. No. 10/475,574. This system comprises a solar-powered warning light system on a timer, so warning lights activate automatically at specific times. This kind of assembly can be very useful at crosswalks adjacent to schools. Posted signs require that traffic slow down when the warning lights are flashing to a slower speed limit. The combined effect of the flashing lights and the reduced speed limit improves safety at crosswalks, while only slowing traffic during specific times. This strategy is effective only when the pedestrian traffic usage of a crosswalk can be predicted, such as the timing of students going to and from school.

Compared with these strategies, active warning systems provide the highest degree of driver awareness and pedestrian safety. Active crosswalk systems are systems that are activated by the pedestrian to warn drivers that the pedestrian wants to cross the road.

U.S. Pat. No. 6,268,805 discloses a solar-powered traffic light and LED light sources. In order to be used at a crosswalk, this system would require trenching or wiring to connect the traffic lights on each side of the road for coordinated activation.

U.S. Pat. No. 6,384,742 discloses a traffic warning system which alerts approaching vehicle traffic to the presence of a pedestrian in a crosswalk. The system includes a plurality of surface mounted lights partially embedded in and placed across a roadway to delineate the crosswalk. This system requires trenching of the road and power from the electricity grid.

U.S. Pat. No. 5,734,339 discloses a crosswalk warning light system which detects a pedestrian entering the crosswalk and activates a light which illuminates the pedestrian so a driver can see and avoid the pedestrian in the crosswalk. This solution requires power from the electrical grid.

Accordingly, an object of the present invention is to provide a crosswalk warning system that can be installed in any desired location without requiring power from the electrical grid and without requiring trenching of the road or overhead wiring such as would normally be required to coordinate the signal lights on each side of the road.

Another object of the present invention is to provide an 'active' crosswalk warning system in which a pedestrian can activate warning beacons prior to using the crosswalk.

Other objects of the invention will be apparent from the summary and the detailed description that follows, and not all such objects are necessarily simultaneously achieved for the principal embodiment of the invention or for each claim of this patent.

SUMMARY OF THE INVENTION

According to one of its aspects, the present invention comprises a crosswalk warning assembly comprising a battery, a solar panel to charge the battery and a control unit to manage the charging of the battery from the output of the solar panel and to perform other control functions. A wireless communication system is provided to enable the assembly to communicate with a similar companion assembly on another side of a roadway. Manual triggering means are provided for activation of signal lights by a pedestrian. Manual triggering causes the signal lights of the assembly to turn on, typically in flashing mode, and causes the communication system to signal the companion assembly that the warning system has been activated so as to allow synchronized operation of the companion assemblies. The control unit, the communication system and the signal lights are each powered by the battery which is in turn charged using the solar panel.

In another of its aspects, the invention comprises such an assembly further comprising power management software associated with the control unit for managing the charging of the battery, the supply of power to the circuitry associated with the assembly, the supply of power to the communication system and the supply of power to the signal lights.

In a further aspect, the invention further comprises signal light control software to control the timing of the flashing of the signal lights, their duration and the coordination of the signal lights between at least two companion assemblies.

In other of its aspects, the invention also comprises software to provide data-logging and system maintenance monitoring.

In another aspect, flash duration and delays between uses can also be configured via the manual triggering means for a predetermined set up time after the battery is first connected in the assembly.

In another of its aspects, the invention provides the solar panel, the battery and the power management control unit in a housing mounted on an adjustable mount so as to be adjustably oriented in relation to the assembly.

In one alternative embodiment of the invention, there is provided software that interfaces with the wireless communication system so as to accept wireless programming of the signal light control software to control such parameters as frequency of flash, length of operation, brightness, to turn on or off automatic dimming features, and to monitor the performance of the unit and its maintenance status.

These together with other objects of the invention, along with the various features which characterize the invention, are pointed out with particularity in the claims annexed to and forming a part of this disclosure.

BRIEF DESCRIPTION OF THE DRAWINGS

The detailed description of the preferred embodiment will proceed by reference to the drawings thereof, in which.

DETAILED DESCRIPTION OF THE PREFERRED EMBODIMENT OF THE INVENTION

Figure 1:
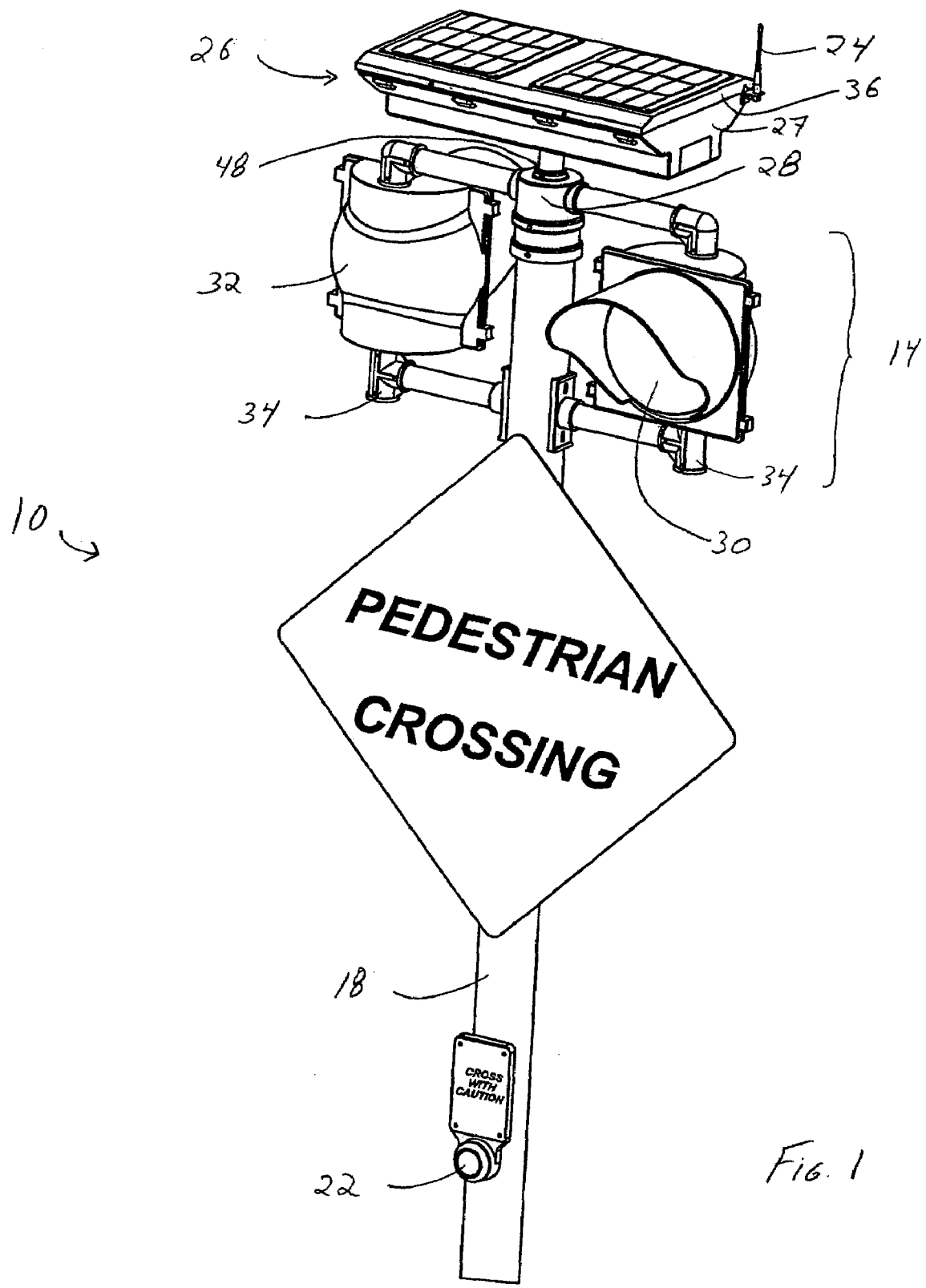
FIG. 1 is a perspective view of one of the assemblies of the preferred embodiment of the invention.
Figure 3:
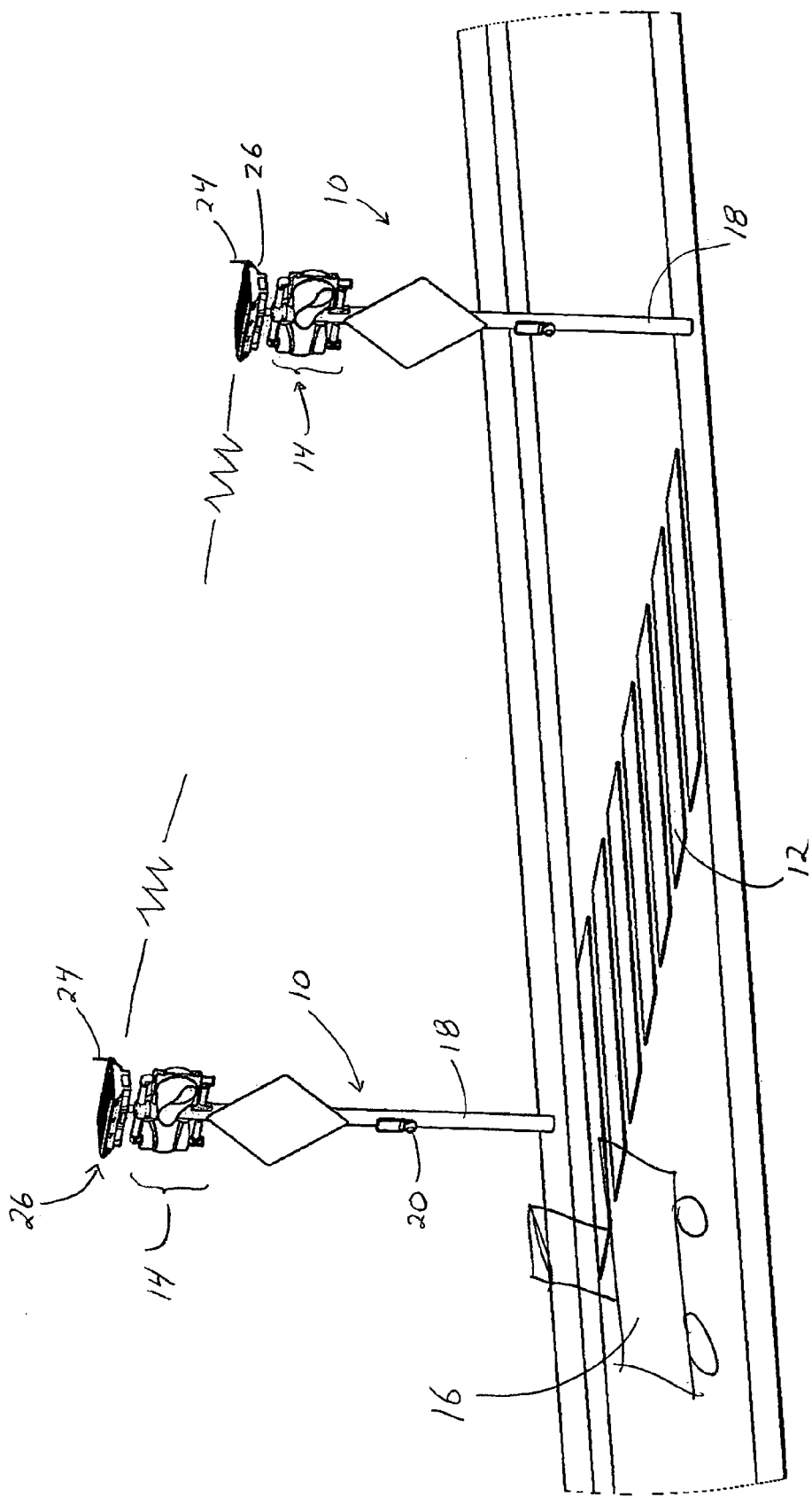
FIG. 3 is a perspective view of the crosswalk warning system showing two assemblies, one on each side of the road at either end of the crosswalk.

FIGS. 1 and 3 illustrate the crosswalk warning system according to the preferred embodiment. Two similar crosswalk warning assemblies 10 are placed at opposite ends of a crosswalk 12. Each assembly includes a signal light sub-assembly 14 to warn cars 16 approaching the crosswalk from either direction. Each crosswalk warning assembly 10 is deployed on a post 18 which includes a push button 20 for the pedestrian to activate the signal light sub-assembly 14. Upon triggering of button 20, wireless communication systems (including a radio module 22 and antennae 24) in each assembly 10 communicate with each other to synchronize the flashing of the signal lights as required. Typically, the lights on one side of the road will be made to flash alternately to the lights on the other side of the road.

Referring to FIG. 1, the principal components of crosswalk assembly 10 are the post 18, a button 20 mounted on the post at pedestrian level, signal light sub-assembly 14 and a power plant sub-assembly 26 mounted on a top cap 28 provided at the top of post 18.

Signal light sub-assembly 14 comprises LED signal lights 30, 32 (normally amber flashers) mounted on a pivoting mount 34 in a conventional manner.

Figure 2A:
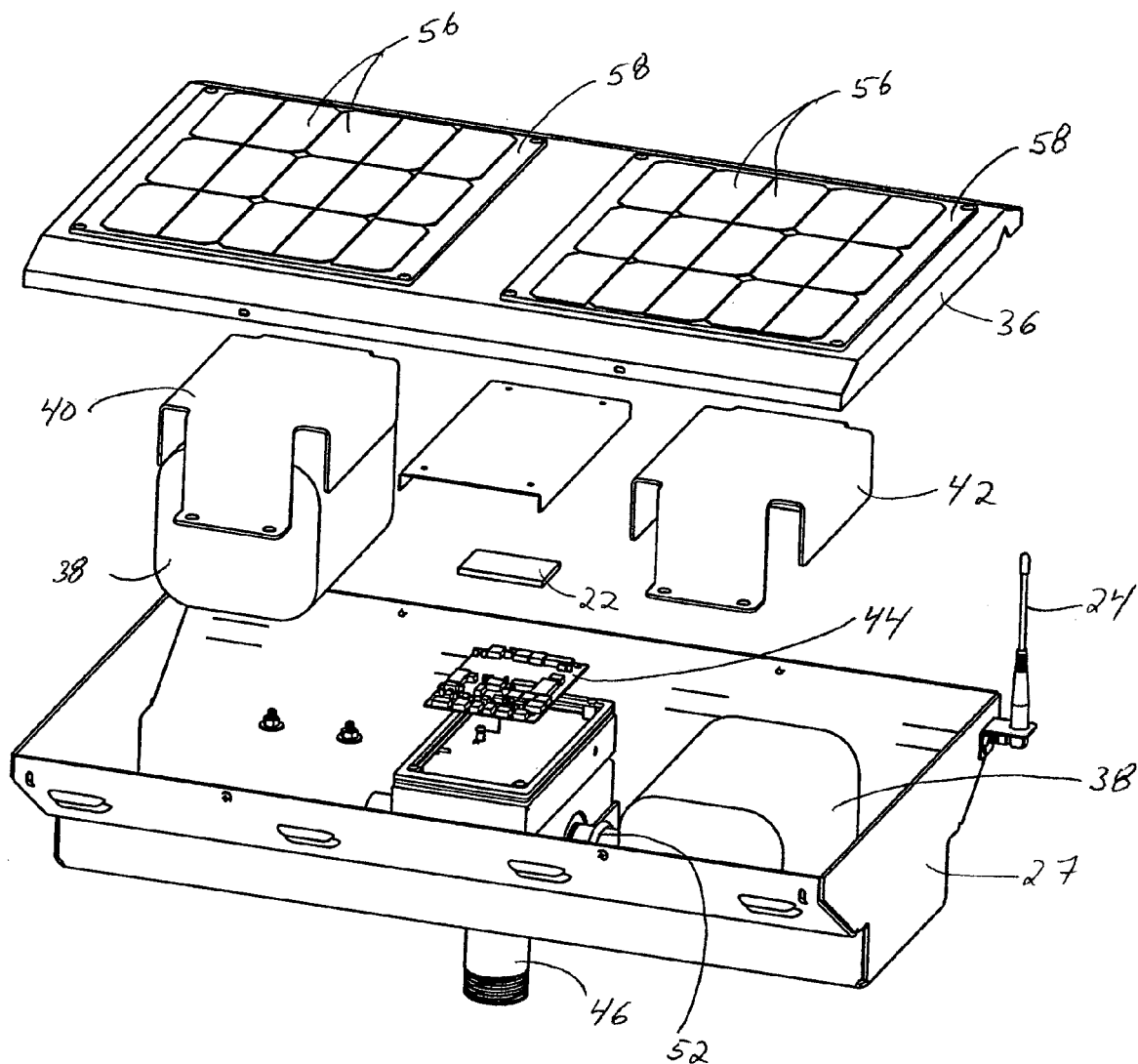
FIG. 2A is a perspective view of the top portion of one of the assemblies of the preferred embodiment with the solar power plant in partially exploded view.
Figure 2B:
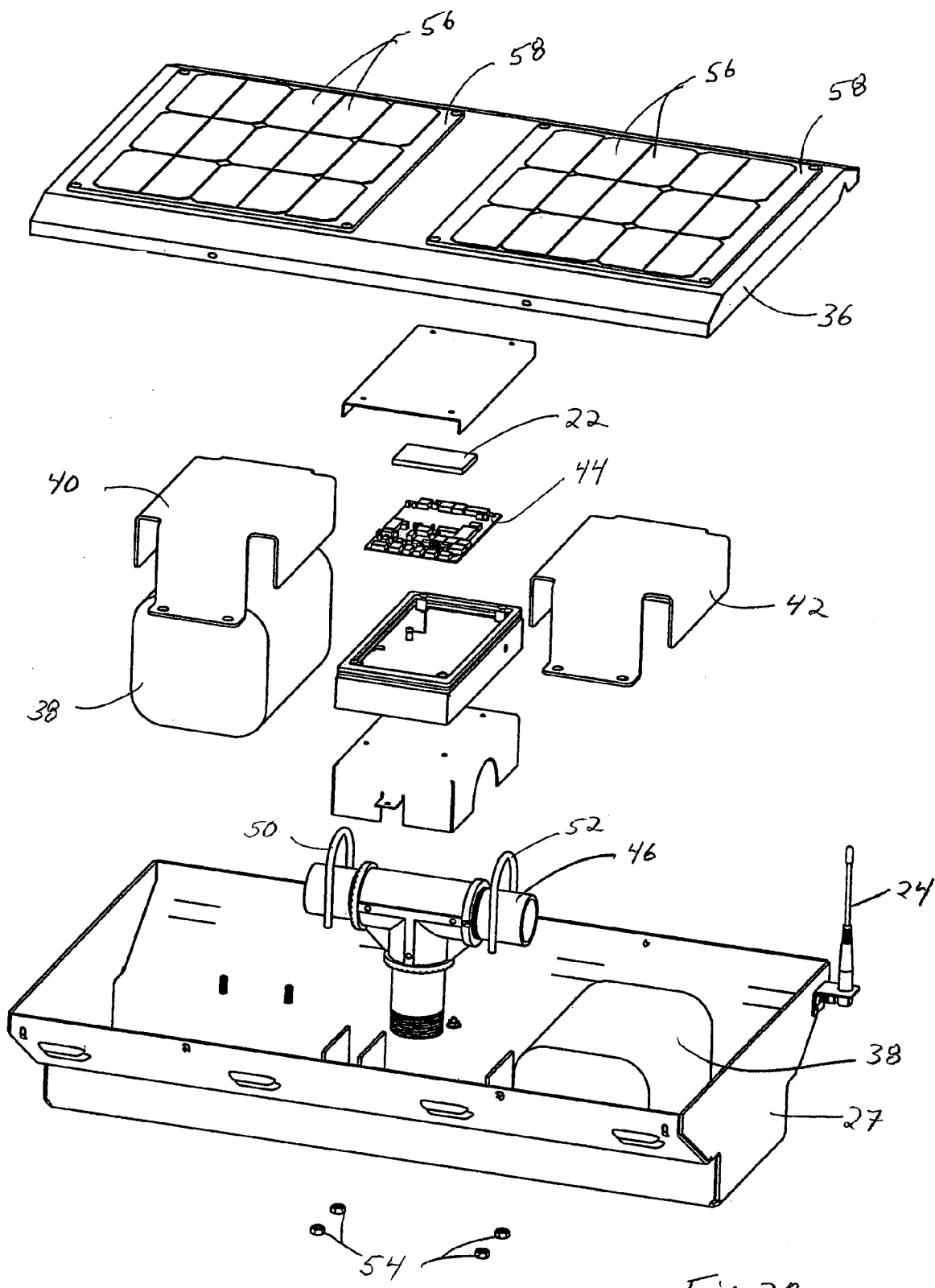
FIG. 2B is a perspective view of the top portion of one of the assemblies of the preferred embodiment with the solar power plant in a more fully exploded view than FIG. 2A.

Referring to FIGS. 2A and 2B, the power plant sub-assembly 26 combines the functions of providing power to the assembly, controlling the flashing, diagnostic and maintenance, and effecting communication between companion assemblies. Power plant sub-assembly 26 includes a housing 27, solar panel platform 36, batteries 38, battery brackets 40,42, control unit 44, wireless communication radio module 22 and antenna 24.

Housing 27 is mounted for pivotal movement on a top tee assembly 46 that is in turn secured to the top cap 28 of the post 18 by means of a set screw 48. Housing 27 includes apertures (not shown) in the base thereof for receiving the ends of two U-bolts 50,52 that are otherwise engaged about the horizontal legs of the top tee assembly 46. The ends of the U-bolts 50,52 are secured to the underside of the base of the housing by means of nuts 54. As a result, the housing 27 may be rotated about the horizontal axis defined by the horizontal legs of the top tee assembly followed by tightening of the nuts 54 so as to fix the orientation of the solar panels to maximize the capture of sunlight. Housing 27 may also be rotated about a vertical axis by releasing set screw 48, rotating the top tee assembly 46 in relation to the top cap 28, and resetting the set screw.

Figure 4A:
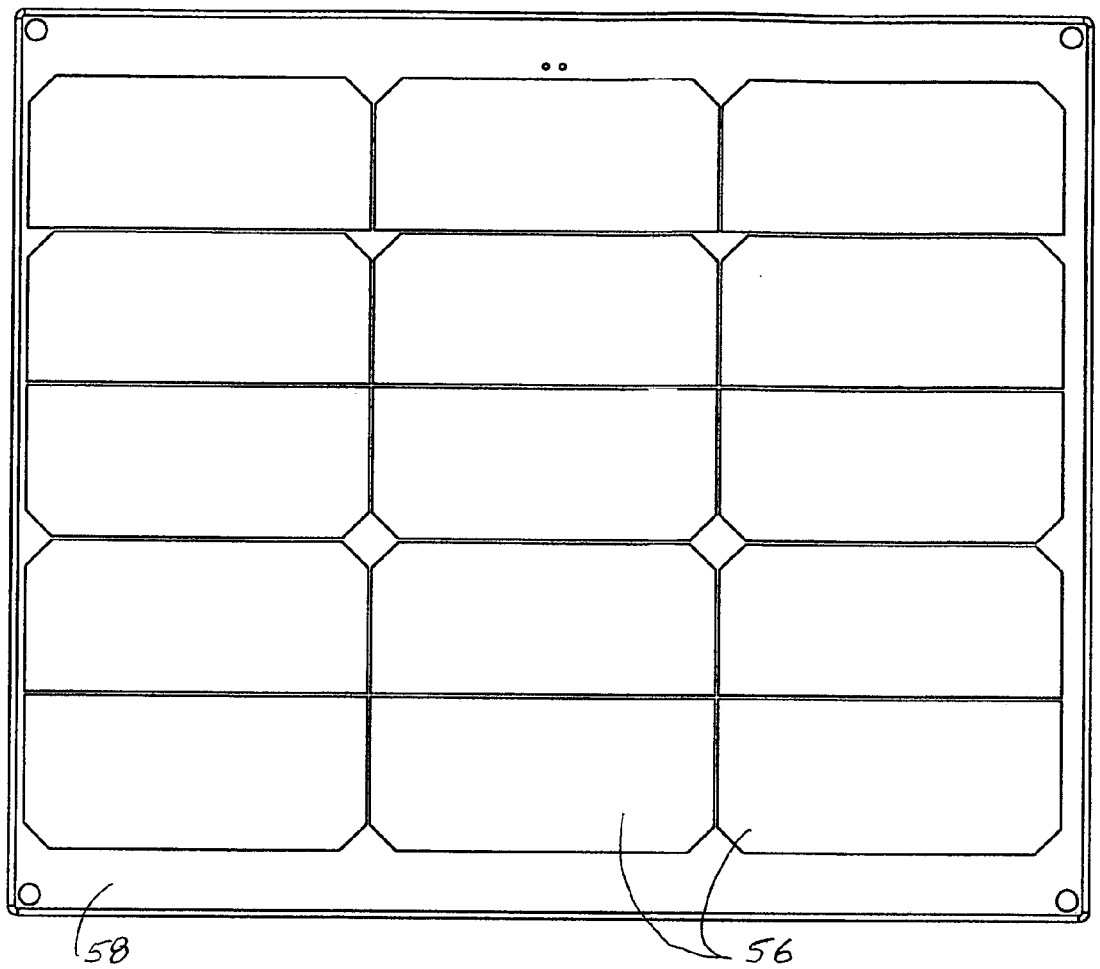
FIG. 4A is a plan view of the solar panel assembly.
Figure 4B:
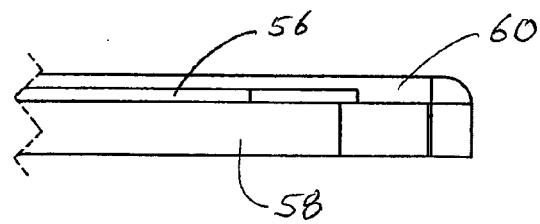
FIG. 4B is a side elevation of the solar panel assembly.

Solar-panel platform 36 comprises a plurality of solar cells 56 arrayed on plates 58. As best illustrated in FIG. 4, the solar cells 56 are sealed from the elements by a ⅛" thick film of clear polymer material 60 that covers the entire array, as described in our co-pending U.S. patent application Ser. No. 10/475,574, the disclosure of which is incorporated herein by reference.

Radio module 22 consists of a transceiver and a dedicated microcontroller capable of configuring the transceiver to receive-only or transmit-only modes, to assign an operational channel or frequency hopping pattern and to assign a data transmission speed. Radio module 22 transmits and receives by means of antenna 24 which is mounted on housing 27.

Batteries 38 provide operating power to the powered components of the, assembly 10, including the control unit 44, the radio module 22, the signal lights 30,32, the push button 20, and any other circuitry associated with the assembly 10. Thus the entire assembly 10 is effectively powered by solar power plant 26.

Programmable microcontroller control unit 44 contains all of the operational software required to operate the crosswalk assembly, including the following functions: managing the charging and loading of the battery, providing operating power to the other components of the crosswalk assembly, controlling the master/slave relationship between companion crosswalk assemblies, synchronizing the lights in the companion assemblies, controlling the duration and duty cycle of the lights, interfacing with the radio module, and data logging and maintenance functions.

The management of the charging and loading of the batteries includes controlling the power used by the signal lights as a function of the charge, and the net discharge rate, of the battery, for example to maintain signal light operation despite low sunlight conditions (either night operation or winter operation).

The software in the control unit 44 also controls the activation of the signal lights so as to achieve the desired flashing mode, duty cycle and overall duration. The software can also be set to limit the number of pedestrian activations that can occur, by for example not allowing the crosswalk to be re-activated until several minutes have passed, to allow traffic to clear.

The data logging function includes recording the battery voltage each day or for a succession of days, recording the number of activations of the crosswalk assembly, the frequency of activation requests, etc.). A self test routine is also provided in the preferred embodiment of the invention.

In operation, pressing the button 20 causes the signal lights 30,32 of the assembly to turn on, typically in flashing mode, and causes the communication system to signal the companion assembly 10 that the warning system has been activated. More specifically, pressing button 20 causes a signal to be sent to control unit 44 indicating that activation of the crosswalk warning system has been requested.

Upon receipt of an activation signal from the push button triggering mechanism 20, controller unit 44 takes the following steps:

initiates a timing sequence corresponding to the duration of the flashing and to the desired flashing mode;

sends a signal to the dedicated microcontroller associated with the radio module 22 to cause the microcontroller to configure the transceiver of the module 22 to operate in transmit-only mode for the duration of a predetermined warning period (for example 20 seconds); and, causes the radio module 22 to transmit a master timing beacon for reception by the companion crosswalk assembly. The master timing beacon indicates the beginning of the warning period.

Upon detection of the master timing beacon by the transceiver of the companion crosswalk assembly, its corresponding control unit 44 configures the transceiver of the companion crosswalk assembly to operate in receive-only mode for the duration of the warning period. The transceivers of the crosswalk assemblies are normally in receive mode, but can be made to transmit at any given time, for example to transmit a master timing beacon when the push button 20 has been triggered. However, when a master timing beacon has been detected from another assembly and the transceiver is set to receive-only mode, triggering the push button at any time during the remainder of the warning period will not cause the transceiver to transmit another master timing beacon, as the transmit mode is suppressed.

For the purposes of the following discussion, the crosswalk assembly that has transmitted the master timing beacon will be designated as the master assembly and the companion crosswalk assembly that receives the master timing beacon will be designated as the slave assembly.

Once the transceiver of the master assembly has been set to transmit-only mode, the master timing beacon has been transmitted to the slave assembly, and the transceiver of the slave assembly has been set to receive-only mode, the control unit 44 causes the signal lights 30,32 of the master assembly to be toggled on and off in accordance with the previously determined flashing parameters. At each toggle on or off, the radio module of the master assembly transmits a signal to indicate the state, or change of state, of each of the lights. In response to each toggle signal received by the slave assembly, the appropriate signal light on the slave assembly is toggled on or off so as to produce the alternate flashing sequence for which the set of crosswalk assemblies has been configured.

Once the warning period has expired, the control units 44 of the master and slave assemblies cause the flashing of the lights to cease and cause both assemblies to return to normal ready mode, subject to the imposition of a waiting period between successive activations of the crosswalk warning system.

Upon first connecting batteries 38 to the control unit 44 during crosswalk installation, software in the control unit causes the control unit to enter into a programming mode whereby the installer can program flash features such as duration and frequency, and delays between activations. The interface used to program the features is the push button 20, which is used according to a predetermined protocol. The software is pre-programmed to allow this manual feature selection mode to remain enabled for a predetermined amount of time, for example 10 minutes.

It will be appreciated that the invention can also be applied to a crosswalk warning system in which there are three or more crosswalk assemblies, with the third assembly being located in the middle of the crosswalk at the center of the road, mounted on a post or suspended from overhead lines, and the other crosswalk assemblies being located at either end of the crosswalk. All three communicating by radio to provide synchronous flashing of warning lights when the crosswalk warning system is triggered by a pedestrian.

It will further be appreciated that although in the preferred embodiment the push button 20 and the transmitter portion of the transceiver are incorporated into a single crosswalk assembly, those two components could be provided in a location that is separate from the signal lights, power plant and the receiver portion of the transceiver.

In certain crosswalks, it may be desirable to provide a crosswalk assembly that is programmed to flash at specified times without requiring manual activation. This may be the case for example at crosswalks adjacent schools in which case the crosswalk warning may be enabled for specified periods during entrance and end of school each day. The control unit can be programmed accordingly, with the detection of the appropriate time of day being otherwise treated as equivalent to a manual triggering of push button 20.

In a further embodiment, a manual override is provided in a simple lock box (not shown) fixed to the post 18. The lock box contains a button or on and off switches to allow a user with access to the lock box to override the control unit and to cause the signal lights to remain in flashing mode until manually reset by such user.

It is also contemplated to provide such a crosswalk assembly that accepts wireless programming of the signal light control software to control such parameters as frequency of flash, length of operation, brightness, to turn on or off automatic dimming features, and to monitor the performance of the unit and its system health, for example using a notebook computer. In order to enable such feature, the control unit 44 would monitor transmissions received by the radio module for receipt of a predetermined supervisory signal, such as is transmitted by the notebook computer. Upon receipt of such signal, the control unit verifies that the crosswalk warning is not in operation, and if it is, it allows the warning period to terminate. The control unit then enters into an authentication and programming mode that verifies incoming authentication signals and if authenticated, then enables communication between the notebook and the control unit to accept new programming.

The preferred and alternative embodiments of the invention have been described in some detail but the reader is reminded that these are preferred embodiments only. Varia-

What is claimed is:

1. A crosswalk warning assembly comprising:
   a battery;
   a solar panel to charge said battery;
   a communication system adapted to transmit data to a similar companion crosswalk warning assembly and receive data from said similar companion crosswalk warning assembly;
   a warning light to signal oncoming traffic; and
   a manual triggering means for activating said communication system and said warning light.

2. The crosswalk assembly of claim 1 wherein said communication system and said warning light are powered by said battery.

3. The crosswalk assembly of claim 2 further comprising a control unit to manage the charging of said battery from the output of said solar panel.

4. The crosswalk assembly of claim 1 wherein said communication system is adapted to respond to activation of said manual triggering means by communicating with a similar companion crosswalk assembly.

5. The crosswalk assembly of claim 4 wherein said communication system is wireless and comprises radio receiver and transmitter means.

6. The crosswalk assembly of claim 5, further comprising a power management control unit to manage the charging of said battery from the output of said solar panel, wherein said power management control unit, said warning light and said communication system are powered by said battery.

7. The crosswalk assembly of claim 4 further comprising software for coordinating the operation of said warning light of said crosswalk assembly with the operation of a warning light of a similar companion crosswalk assembly.

8. The crosswalk assembly of claim 6 further comprising software for synchronizing the operation of said warning light of said crosswalk assembly with the operation of a warning light of a similar companion crosswalk assembly.

9. The crosswalk assembly of claim 8 wherein said software controls a feature of said operation from among the set of features comprising the timing of the flashing of the warning light, the duration of the operation of the warning light and delays between uses.

10. The crosswalk assembly of claim 2 further comprising a housing containing said communication system and said battery, said housing also supporting said solar panel.

11. The crosswalk assembly of claim 10 wherein said housing is pivotable about a horizontal axis.

12. The crosswalk assembly of claim 11 wherein said housing is pivotable about a vertical axis.

13. The crosswalk assembly of claim 10, 11 or 12 wherein said solar panel is protected from the elements by being encased in a layer of clear polymer.

14. The crosswalk assembly of claim 8 wherein activation of said triggering means causes said radio receiver and transmitter means to enter into transmit-only mode for a predetermined time.

15. The crosswalk assembly of claim 8 wherein receipt by said radio receiver and transmitter means of a master timing beacon causes said radio receiver and transmitter means to enter into receive-only mode for a predetermined time.

16. The crosswalk assembly of claim 15 wherein said control unit causes said warning light to illuminate each time a signal is received by said radio receiver and transmitter means indicating that a warning light on a similar companion crosswalk assembly has turned on or off.

17. A multiple crosswalk assembly system comprising three crosswalk assemblies as in claim 1, one of said crosswalk assemblies being located in the middle of a crosswalk and mounted on a post or suspended from overhead wires.

18. A crosswalk assembly comprising:
   a battery;
   a solar panel to charge said battery;
   a communication system adapted to transmit data to a similar companion crosswalk warning assembly and receive data from said similar companion crosswalk warning assembly;
   a warning light to signal oncoming traffic; and
   remote manual triggering and transmitting means for communicating to said communication system an activation of said manual triggering means.

19. The crosswalk warning assembly of claim 8 wherein said control unit is adapted to monitor said communication system for receipt of a signal indicating that the crosswalk warning assembly is to be remotely programmed.

20. The crosswalk warning assembly of claim 9 wherein said software is programmed to cause said warning lights to flash at specified hours for a specified period of time.

* * * * *

(12) EX PARTE REEXAMINATION CERTIFICATE (10288th)
United States Patent
Green et al.

(10) Number: US 7,317,405 C1
(45) Certificate Issued: Sep. 4, 2014

(54) SOLAR-POWERED WIRELESS CROSSWALK WARNING SYSTEM

(75) Inventors: David Rohin Green, Victoria (CA); Jim Ward, Saanichton (CA); Neil Wyper, Victoria (CA)

(73) Assignee: Carmanah Technologies Corporation, Victoria, British Columbia (CA)

Reexamination Request:
No. 90/012,920, Aug. 19, 2013

Reexamination Certificate for:
Patent No.: 7,317,405
Issued: Jan. 8, 2008
Appl. No.: 10/995,264
Filed: Nov. 24, 2004

Related U.S. Application Data

(63) Continuation-in-part of application No. 10/475,574, filed on Aug. 9, 2005, now abandoned.

(51) Int. Cl.
*G08G 1/095* (2006.01)

(52) U.S. Cl.
USPC ........... 340/907; 340/908; 340/925; 340/944; 116/63 R

(58) Field of Classification Search
None
See application file for complete search history.

(56) References Cited

To view the complete listing of prior art documents cited during the proceeding for Reexamination Control Number 90/012,920, please refer to the USPTO's public Patent Application Information Retrieval (PAIR) system under the Display References tab.

*Primary Examiner* — Minh Dieu Nguyen

(57) ABSTRACT

A solar-powered crosswalk warning system is disclosed. The crosswalk warning system comprises two or more crosswalk warning beacons, located on opposite sides of the road. Each beacon comprises a solar panel to recharge a battery, a battery back, a control unit to charge the battery pack during daylight hours, a communication unit to communicate to the second crosswalk beacon, a traffic signal lamp ton warn oncoming traffic, and a triggering means by which the pedestrian can activate the beacons.

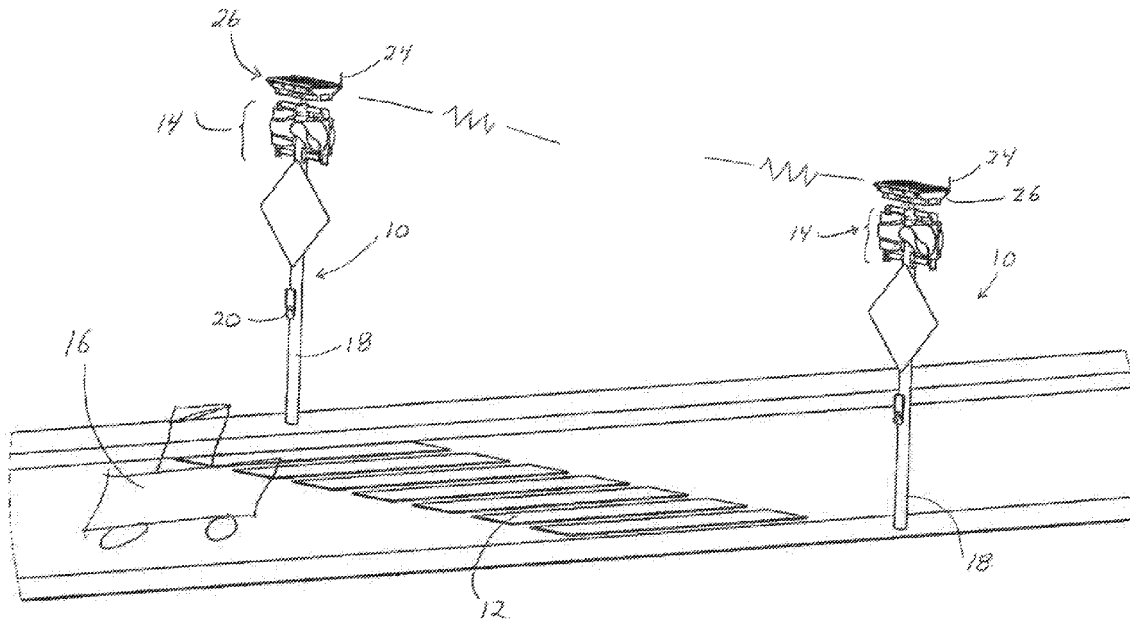

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 16 is confirmed.

Claims 1-14 and 17-20 are cancelled.

New claim 21 is added and determined to be patentable.

Claim 15 was not reexamined.

*21. A crosswalk warning system comprising at least two similar companion crosswalk warning assemblies, wherein each of said companion assemblies is similar in that each of said assemblies comprises:*

*a battery;*

*a solar panel to charge said battery;*

*a communication system adapted to transmit data to an other one of said companion assemblies and receive data from said other one of said companion assemblies;*

*a warning light to signal oncoming traffic; and*

*a manual triggering means for activating said communication system and said warning light;*

*and wherein each of said companion assemblies is configured to act as a master transmitting data in response to a triggering of its respective manual triggering means, and as a slave in response to receiving a transmission from an other one of said companion assemblies.*

\* \* \* \* \*